(12) United States Patent
Schmitz et al.

(10) Patent No.: US 11,399,222 B2
(45) Date of Patent: *Jul. 26, 2022

(54) METHOD FOR COLLECTING DATA, SENSOR AND SUPPLY NETWORK

(71) Applicants: DIEHL METERING SYSTEMS GMBH, Nuremberg (DE); DIEHL METERING S.A.S, Saint Louis (FR)

(72) Inventors: Stefan Schmitz, Nuremberg (DE); Thomas Kauppert, Nuremberg (DE); Petra Joppich-Dohlus, Rathsberg (DE); Achim Schmidt, Weissenohe (DE); Christoph Sosna, Nuremberg (DE); Klaus Gottschalk, Winkelhaid (DE); Guy Bach, Waldighoffen (FR); Aster Breton, Mullhouse (FR)

(73) Assignees: Diehl Metering Systems GmbH, Nuremberg (DE); Diehl Metering S.A.S., Saint Louis (FR)

( * ) Notice: Subject to any disclaimer, the term of this patent is extended or adjusted under 35 U.S.C. 154(b) by 36 days.

This patent is subject to a terminal disclaimer.

(21) Appl. No.: 16/715,064

(22) Filed: Dec. 16, 2019

(65) Prior Publication Data

US 2020/0196033 A1    Jun. 18, 2020

(30) Foreign Application Priority Data

Dec. 14, 2018  (DE) .............................. 102018009823

(51) Int. Cl.
 *G01D 4/00*      (2006.01)
 *H04W 4/38*      (2018.01)
  (Continued)

(52) U.S. Cl.
 CPC ............... *H04Q 9/02* (2013.01); *G01D 4/002* (2013.01); *G01R 21/007* (2013.01); *H04W 4/38* (2018.02);
  (Continued)

(58) Field of Classification Search
 None
 See application file for complete search history.

(56) References Cited

U.S. PATENT DOCUMENTS

| 8,949,055 B2 | 2/2015 | Hampel |
| 2004/0113812 A1* | 6/2004 | Bianchi ................... H04Q 9/00 340/870.02 |

(Continued)

FOREIGN PATENT DOCUMENTS

| DE | 102011078824 A1 | 1/2013 |
| DE | 102016007287 A1 | 12/2017 |

(Continued)

*Primary Examiner* — Curtis A Kuntz
*Assistant Examiner* — Jerold B Murphy
(74) *Attorney, Agent, or Firm* — Laurence A. Greenberg; Werner H. Stemer; Ralph E. Locher

(57) ABSTRACT

A method for collecting data, preferably in connection with a consumption, a physical or physico-chemical parameter and/or an operating state in a supply network for consumables. A measuring element of a local sensor supplies raw measurement data in the form of elementary measurement units that correspond to a physical or physico-chemical variable or parameter. In order to define the measurement resolution of the sensor, the conditions for generating time stamps are defined in advance using a correlation model, time stamps of successive items of raw measurement data are generated in the sensor on the basis of the correlation model, the time stamps are transmitted so that the raw measurement data acquired by the measuring element is reconstructed on the basis of the time stamps using the (Continued)

correlation model, and analyzed. The transmission is performed with a dynamically adaptable redundancy.

24 Claims, 10 Drawing Sheets

(51) Int. Cl.
*H04Q 9/02* (2006.01)
*G01R 21/00* (2006.01)

(52) U.S. Cl.
CPC . *H04Q 2209/60* (2013.01); *H04Q 2213/1313* (2013.01)

(56) References Cited

U.S. PATENT DOCUMENTS

| | | | |
|---|---|---|---|
| 2009/0135836 A1* | 5/2009 | Veillette | G01D 4/004 370/400 |
| 2012/0280832 A1* | 11/2012 | Jonsson | G01D 4/00 340/870.02 |
| 2016/0329928 A1* | 11/2016 | Beroset | H04L 69/04 |
| 2018/0234970 A1* | 8/2018 | Hall | H04W 72/0453 |
| 2018/0284735 A1* | 10/2018 | Celia | G05B 19/4184 |
| 2020/0128309 A1 | 4/2020 | Bach | |
| 2020/0162205 A1* | 5/2020 | Han | H04L 1/1825 |

FOREIGN PATENT DOCUMENTS

| | | |
|---|---|---|
| EP | 2449705 B1 | 4/2013 |
| WO | 2018233865 A1 | 12/2018 |

* cited by examiner

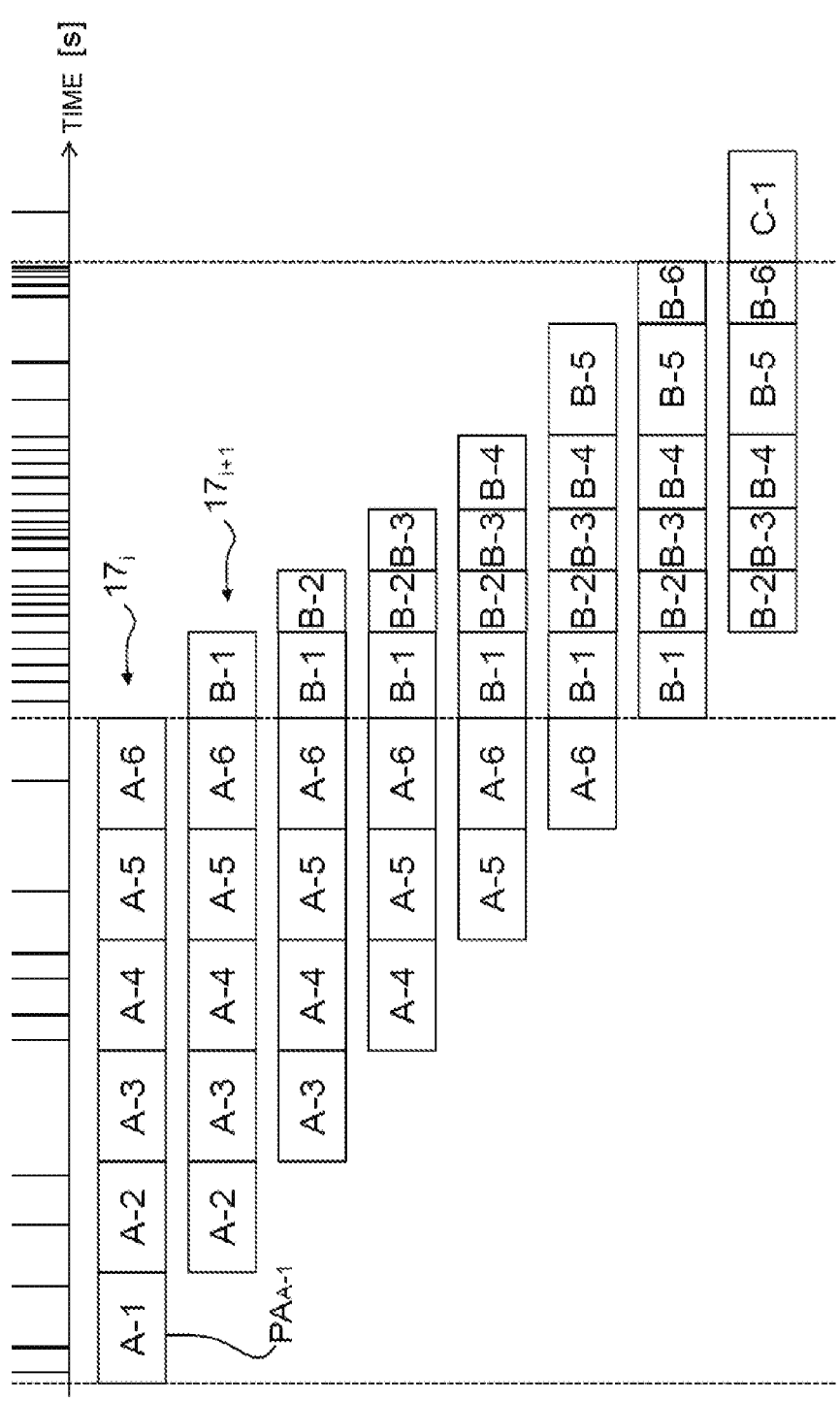

METHOD FOR COLLECTING DATA, SENSOR AND SUPPLY NETWORK

CROSS-REFERENCE TO RELATED APPLICATION

This application claims the priority, under 35 U.S.C. § 119, of German patent application DE 10 2018 009 823, filed Dec. 14, 2018; the prior application is herewith incorporated by reference in its entirety.

BACKGROUND OF THE INVENTION

Field of the Invention

The present invention relates to a method for collecting data, preferably data associated with a consumption, a physical or physico-chemical parameter and/or an operating status during operation of a local sensor, preferably of a sensor for a consumption meter, as a component of a supply network for distributing a consumable. The supply network comprises at least one local sensor, preferably a plurality of local sensors, and the sensor includes a measuring element. The measuring element of the sensor supplies, as raw measurement data, elementary measurement units, which correspond to at least one physical or physico-chemical variable or at least one physical or physico-chemical parameter, and the sensor is equipped for communication and includes a memory.

The invention further pertains to a sensor that is configured for the use in performing the method.

Finally, the invention also pertains to a supply network for distributing a consumable medium. The supply network includes at least one local sensor, preferably a plurality of local sensors, for generating and/or transferring raw measurement data, preferably raw measurement data associated with a consumption of a consumption medium, a physical or physico-chemical parameter and/or an operating status of a consumption meter, a data collector, a primary communication path between the respective sensors and the data collector, a head-end for analyzing the data, and a tertiary communication path between the data collector and the head-end.

Consumption meters are components of supply networks for distributing consumables such as gas, water, heat or electricity, for instance, and are used for generating consumption data. Consumption data is calculated by a microprocessor located at the meter on the basis of raw measurement data supplied by a measuring element of a sensor, and transferred via a communication system in the form of a BUS system, in particular what is known as an M-BUS system or wireless M-BUS system, to a central data management system (head-end system). The data primarily involves the latest consumption, i.e. the meter reading.

Raw measurement data from the measuring element of a sensor of the consumption meter is generated at predetermined set times, analyzed by a microprocessor of the consumption meter, i.e. converted into consumption data, and the resultant consumption data is then retrieved by a reader or receiving device (data collector or concentrator) via a primary communication path at defined times from the individual, locally arranged consumption meter. Then the reader or receiving device forwards the consumption data via a tertiary communication path, for example based on LAN, GPRS, 3G, LTE, to a head-end system. The consumption data can then be displayed in the head-end or used for invoicing. The approach to date towards acquiring consumption data is limited in terms of both its depth of information and breadth of information.

SUMMARY OF THE INVENTION

It is accordingly an object of the invention to provide a data collection method, a sensor, and a supply network, which overcome the above-mentioned and other disadvantages of the heretofore-known devices and methods of this general type and which provide for a method of the type in question for collecting and/or transferring data, a sensor to be used for the purpose, and a corresponding supply network, each with increased information content.

With the foregoing and other objects in view there is provided, in accordance with the invention, a method for collecting data method for collecting data during operation of a local sensor in a supply network for distributing a consumable, the method comprising:

providing the sensor with a measuring element, with radio communication capability and a memory;

providing elementary measuring units with the measuring element of the sensor, the elementary measuring units corresponding to at least one physical or physico-chemical variable or at least one physical or physico-chemical parameter and forming raw measurement data;

defining a measurement resolution of the sensor by defining via a correlation model conditions for generating time stamps in advance;

generating time stamps of successive items of raw measurement data in the sensor on a basis of the correlation model;

transmitting the time stamps, reconstructing the raw measurement data acquired by the measuring element based on the time stamps using the correlation model, and analyzing the reconstructed measurement data; and thereby performing the transmitting step with a dynamically adaptable redundancy.

In other words, according to the invention, in order to define the measurement resolution of the sensor, the conditions for generating time stamps are defined in advance using a correlation model. Time stamps of successive items of raw measurement data are generated in the sensor on the basis of the correlation model and saved in the memory. Then solely the time stamps assigned to the acquired raw measurement data are transmitted, for instance via a wired link and/or via a radio path, so that after successful transmission, the raw measurement data acquired by the measuring element can be reconstructed again on the basis of the time stamps using the correlation model, and analyzed. This dispenses with computationally complex and hence energy-intensive processing operations in the region of the local sensor. Computationally complex and energy-intensive processing operations can thus be transferred into the region of a data collector or of a head-end. The method according to the invention allows time stamps of raw measurement data to be provided in a consecutive, complete and consistent time relationship, i.e. contiguously, in the region of the data collector, a retrieval device or a concentrator, and then to be supplied to the head-end via a tertiary communication path. The raw measurement data reconstructed from the time stamps can be assigned continuously to the time-line, i.e. models a real-time progression, which excludes discontinuities or times in which data is missing. The continuous raw measurement-data stream produced in the head-end in accordance with the method according to the invention has a far higher resolution over the continuous time axis compared with previous solutions. The invention allows a much larger number of calculations and/or assessments and/or functions, including business functions, to be carried out in the head-end, for instance in addition to a consumption calculation, than was previously possible. The method according to the invention also makes it possible to assess the status of a supply network. The supplier can thereby offer the customer of a supply network far better transparency than hitherto. In addition, by virtue of the method according to the invention, the design of the sensor can be far simpler and cheaper, because complex microprocessors for calculations are not required. The acquired temporal relationship of the raw measurement data means that tampering can be prevented, because the measurement results over their entire time progression can be compared with empirical values along the entire time axis. Moreover, thanks to the elimination of energy-intensive processing power, the energy consumption of the module comprising sensor and the time-stamp provider or the communication means is far lower than in previous embodiments that analyze the data locally. The time stamps may be time instants or time differences. The time instants or time differences may be actual time data or real-time data, or at least be based thereon. The time differences may be formed from time stamp to time stamp and/or with respect to a fixed time instant.

This form of analysis requires a continuous, complete and consistent data stream of time stamps. In order to guarantee the reliability of the data stream even for radio links of poor transmission quality, the data or the time stamps are transmitted with redundancy, which can be adapted dynamically during operation. A static or fixed redundancy rate does not reflect the actual quality of the link or of the radio link. Redundancy consumes additional resources such as bandwidth and battery power. The consumption of resources is optimized by adapting the redundancy to the quality of the link or of the radio link. For example, a lower redundancy is needed for sensors or consumption meters that have a good link quality or radio link quality, and therefore these sensors or consumption meters consume less battery power. Using a smaller bandwidth reduces, for instance, the channel load, with the result that the channel capacity can be used for sensors or consumption meters that have a poorer link quality. It is hence possible to optimize the performance of the link or of the radio link of the entire network. In addition, the quality of the radio transmission can vary over time, and therefore the redundancy can be adapted to these variations.

The local sensor(s) can expediently be in communication with a data collector via a primary communication path. A tertiary communication path can exist between the data collector and a head-end. In addition, the time stamps transmitted from sensors can be collected, saved and/or analyzed in the data collector and/or in the head-end. The transmission of the time stamps via the primary and tertiary communication paths allows a much larger number of calculations and/or assessments and/or functions, including business functions, to be carried out in the head-end, where sufficient processing power is available, than was previously possible.

The time stamps can be transmitted preferably in compressed form. It is precisely the method according to the invention that makes this possible. Thus the method according to the invention allows a simpler definition of, for example, equidistant time stamps for the transmission thereof.

The time stamps can be compressed in a loss-free manner in the region of the sensor. Alternatively, however, the time stamps can also be compressed at a specified admissible loss level. If the data is compressed at a specified admissible loss level, then if the user or operator prioritizes energy saving and accepts a certain degree of imprecision in the restoration and reproduction of the original measurement data (i.e. accepts a certain loss), the compression ratio can then be increased at the expense of lower precision in the reproduction at the receiver end. The loss ratio or the compression ratio can be provided as a programmable or configurable parameter, which defines or configures the compression mode.

The following examples of data compression algorithms, which are illustrative and shall have no limiting effect, can be considered in the context of the present invention: differential compression (Delta encoding) in conjunction with Huffman coding, run-length encoding (RLE) or preferably adaptive binary arithmetic coding (CABAC).

With the correlation model, a specific value or a specific change in value or a specific difference in value of the at least one physical or physico-chemical variable or of the at least one physical or physico-chemical parameter can be defined for the purpose of assigning a time stamp, wherein when the measuring element detects the specific value or the specific change in value or the specific difference in value, the time stamp is actuated, saved as such in the memory of the sensor and provided for the transmission. If the value detected by the sensor does not change, no time stamp is produced. Thus it is typical of the method according to the invention that prolonged time periods can pass without any time stamp. Hence data does not need to be transmitted constantly. Nevertheless, the method has a very high resolution.

In particular, a meter reading that increases in steps or incrementally and/or a value table can be modeled within the correlation model using time stamps.

The time stamps are preferably given a sign, e.g. a plus or minus sign. This is advantageous especially when modeling a value table, because it defines whether the actual time stamp relates to an increasing or decreasing value in the value table.

According to the invention, a plurality of time stamps can be transmitted as one data packet along the primary communication path.

A raw measurement-data stream can advantageously be generated using the correlation model on the basis of the time stamps received at the data collector and/or at the head-end. The successive time stamps concerned in particular do not involve any calculations and/or analyses.

The raw measurement-data stream expediently has a temporal resolution that is defined, or at least determined, by the sensor sampling rate or measuring element sampling rate, or a multiple thereof. The temporal resolution of the raw measurement-data stream preferably lies in the region of seconds, in the region of tenths of seconds, in the region of hundredths of seconds, or in the region of thousandths of seconds.

The raw measurement-data stream on the basis of the defined resolution is advantageously continuous and/or complete. This results in a particularly high measured-value resolution along the continuous time-line, and in turn an especial depth of information as the basis for analyses or calculations based thereon.

In the further course of the data processing, the raw measurement-data stream can preferably be analyzed at any time on a time-historical basis with no time gaps, aside from its temporal resolution (sampling rate or multiple of the sampling rate). This results in the advantage that, for instance, even event-driven status changes in the supply network that lie in the past (for instance changes such as overflow, underflow, leaks, tampering attempts, etc.) can be ascertained or documented with a precise time association and without gaps. In addition, it is possible to show the consumer past consumption data far more precisely and/or to involve the consumer more effectively in analyses of consumption behavior or changes therein. This, in turn, has the effect of optimizing consumption, and for the consumer constitutes particularly important information from the network supplier.

There is also the option to delete the saved time stamps in the memory of the sensor only once the transmission of the time stamps via the primary communication path has been confirmed by the receiver or data collector.

In order to produce the continuous raw measurement-data stream, the data packets are expediently assembled in a corresponding time-sequence reference or at least placed in relation to one another, so that the time stamps contained in the packets are subsequently re-assembled along the real-time axis in accordance with their sampling and prior allocation into packets, or are at least placed relative to one another consecutively in time.

For example, elementary measurement units may be the voltage or the current that is measured. For instance, it is possible to detect the output voltage from a Hall effect sensor in the event of it being excited, or the voltage from a temperature sensor. The measured physical variable can expediently relate to a supply medium, preferably water, electricity, fuel or gas, of a supply network.

It is possible that the, or one of the, measured physical or chemical/physical parameter(s) is an indicator of the volume, quality and/or composition of a fluid that is flowing through, or makes contact with, the sensor concerned.

The elementary measurement unit can expediently generate a time stamp as soon as the elementary measurement unit receives a pulse.

Settling the question of when a new data transmission in the form of a message or a telegram (of one or more data packets) is meant to take place, preferably depends on whether at least one of the following two conditions is met:
  (a) a specified time interval has elapsed; and
  (b) a specified amount of time stamps has been reached since the previous transmission.

A time-sequence reference for the data packets to be transmitted can be implemented simply on the basis thereof.

It is particularly expedient that the method comprises packaging the time stamps by formatting in data packets of a predetermined fixed size, wherein a new transmission is actuated wherever the accumulated data reaches the size of a data packet, or the specified time interval has elapsed.

The redundancy in the transmission can advantageously be achieved by repeatedly sending the same data packet in a plurality of successive transmission processes. It is also possible to achieve the redundancy in the transmission by repeatedly sending the same time stamps. For example, the transmission of a data packet or of a time stamp can be repeated five times.

The number of send-repetitions can advantageously be defined by a redundancy factor. The value of the redundancy factor can define the number of repetitions.

The redundancy factor can expediently be defined dynamically by a data collector and/or a head-end. It is possible to define the redundancy factor dynamically according to the quality of the radio link. For this purpose, the data collector and/or the head-end can monitor and analyze the quality of the radio link. Various metrics can be used for this analysis, for instance the frame loss ratio (FLR) or the signal quality by means of the signal-to-noise ratio (SNR) or received signal strength indicator (RSSI). The redundancy factor is adapted according to the metrics for the quality of the radio link. For example, for a radio link with a very low loss rate, the data or data packets or time stamps are sent two or three times in repetition. On the other hand, for instance for a radio link of poor transmission quality, the number of repetitions is increased to 7 or 8, for example. Since the quality of the radio link can vary over time, it is necessary to perform continuous monitoring and adaptation of the redundancy or redundancy factor. Algorithms can be implemented in the head-end or in the data collector that are based on the metrics for the quality of the radio link and automatically optimize the redundancy or the redundancy factor.

Alternatively or additionally, it is possible to adapt properties or parameters of the radio link according to the number of received repetitions as a result of the redundancy. The redundancy is used for this purpose, for instance in order to control parameters and/or settings for the radio link actively in the head-end. For example, for a sensor or consumption meter having a large amount of redundant data in the head-end, the transmit power thereof can be reduced and/or the transmission interval thereof can be increased and/or the data rate thereof can be raised. The transmission interval can be increased, for example from 5 minutes to 15 minutes. As a result of a larger transmission interval, the sensor or the consumption meter can advantageously save energy and the load on the entire network or radio network can be reduced.

The present invention also relates to a sensor that is designed for local use in a supply network for distributing a consumption medium such as water, gas, electricity, fuel or heat, for instance, which supply network comprises a plurality of local sensors and a data collector that is in communication with the local sensor(s) via a primary communication path. According to the present invention, the sensor is characterized in that it is operated in accordance with the method as outlined above. Such a sensor may be a component of a consumption meter. It makes it possible to guarantee, during operation of a supply network, the consumption and additional status properties in very high resolution along the time-line contiguously and continuously.

With the above and other objects in view there is also provided, in accordance with the invention, a supply network for distributing a consumption medium, the supply network comprising:
  at least one local sensor for generating and/or transmitting raw measurement data, said local sensor being configured for operation within a method as described;
  a data collector;
  a primary communication path between said sensor and said data collector;
  a head-end for analyzing the measurement data; and
  a tertiary communication path between said data collector and said head-end.

In other words, the present invention also relates to a supply network for distributing a consumable medium such as gas, water, electricity, fuel or heat, for instance, comprising at least one local sensor, preferably a plurality of local sensors, for generating and/or transferring raw measurement data, preferably raw measurement data relating to a consumption of a consumable medium and/or relating to an operating status of a consumption meter, comprising a data collector, a primary communication path between the respective sensors and the data collector, a head-end for analyzing the data, and a tertiary communication path between data collector and head-end. According to the present invention, the supply network is characterized in that the sensor(s) located therein are operated in accordance with the method as outlined above.

Other features which are considered as characteristic for the invention are set forth in the appended claims.

Although the invention is illustrated and described herein as embodied in method for collecting data, sensor and supply network, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE SEVERAL VIEWS OF THE DRAWING

FIG. 10A, FIG. 10B, and FIG. 10C show examples of redundant transmissions of the $PA_j$ data packets using different redundancy factors.

DETAILED DESCRIPTION OF THE INVENTION

Figure 1:
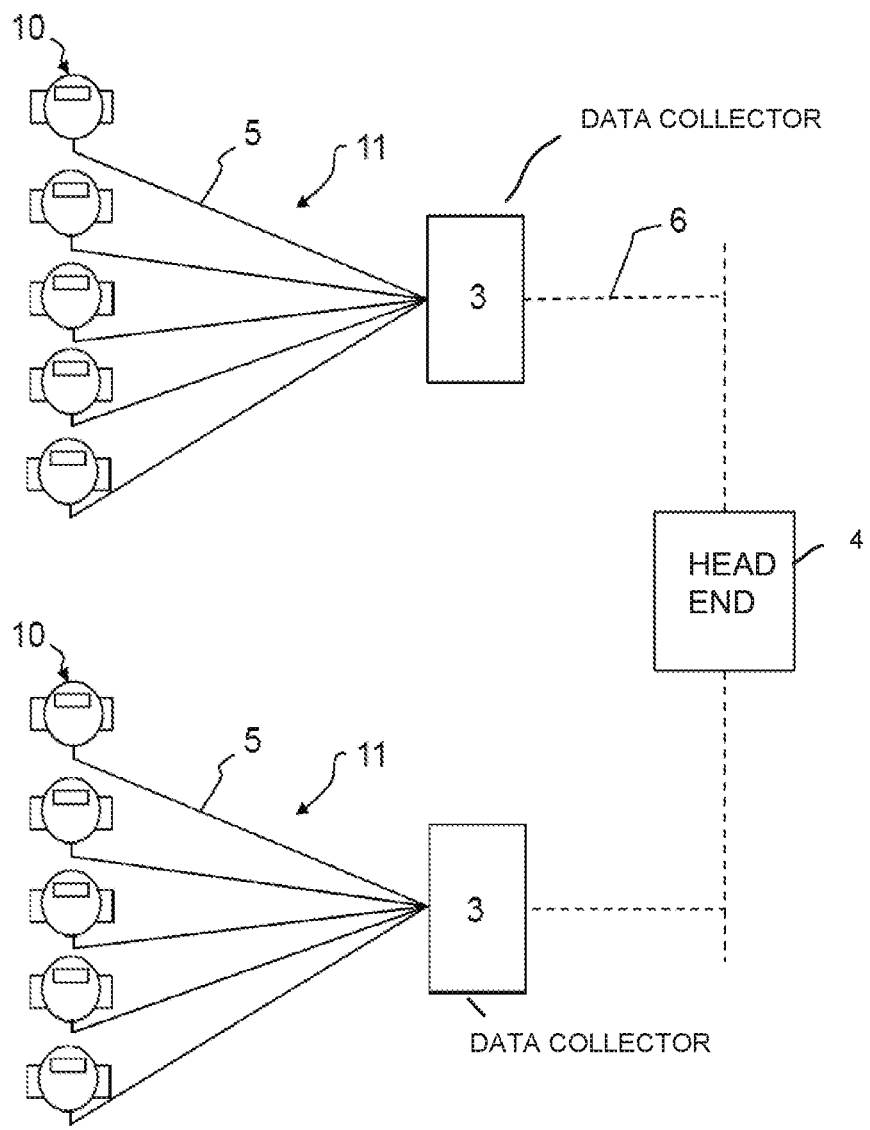
FIG. 1 is a highly simplified schematic diagram of an example of communication paths of a supply network for collecting and/or transferring to a data collector and a head-end, data obtained by a multiplicity of consumption meters.

FIG. 1 shows a supply network for distributing consumable media such as gas, water, electricity, fuel or heat, for example. The supply network comprises a multiplicity of individual local consumption meters 10, which can be assigned, for instance, to different residential units of an apartment building. The individual consumption meters 10, for instance water meters, heat meters, electricity meters or gas meters, are connected to a data collector 3 via a primary communication path 5 such as a radio path, for example. The data transmission from the respective consumption meters 10 to the data collector 3 via the primary communication path 5 is called an "uplink transmission".

Each individual consumption meter 10 can expediently be given an associated ID (address), so that the data collector 3 can address each individual consumption meter 10 directly and retrieve the data available in the relevant consumption meter 10.

The transmission via the primary communication path 5 is defined by a BUS transmission protocol, for instance by the wireless M-BUS transmission protocol.

Each data collector 3 is in communication with what is known as a head-end 4 via a tertiary communication path 6. The data from the entire supply network comes together in the head-end 4. The tertiary communication path 6 may be a wired communication path or a communication path based on radio technology (e.g. a mobile communication path). Alternatively, if required, the data from each data collector 3 can also be read by a portable reader and downloaded again at the head-end 4. The data can be transmitted along the tertiary communication path 6 in various ways, for instance via LAN, GPRS, LTE, 3G, 4G, etc.

A secondary communication path refers to a communication path that interconnects a plurality of data collectors or concentrators, but this is not relevant here.

The individual consumption meters 10 can be operated by an autonomous energy supply (battery).

As FIG. 1 shows schematically, the preferably compressed and formatted time stamps TS for each sensor 1 or consumption meter 10 concerned are transmitted to the data collector 3, which manages a local network of a multiplicity of consumption meters 10 or sensors 1 assigned to said data collector. The preferably compressed and formatted time stamps TS for each of the sensors 1 which are part of the supply network are transmitted from the data collector 3 to the head-end 4.

The data collector 3 can save over a time interval (e.g. a day) the time stamps TS retrieved from the respective sensors 1 or consumption meters 10, and then transfer said time stamps to a processing location or to the head-end 4. Alternatively, the data from the data collector 3 can also be transferred immediately to the head-end 4.

Figure 2:
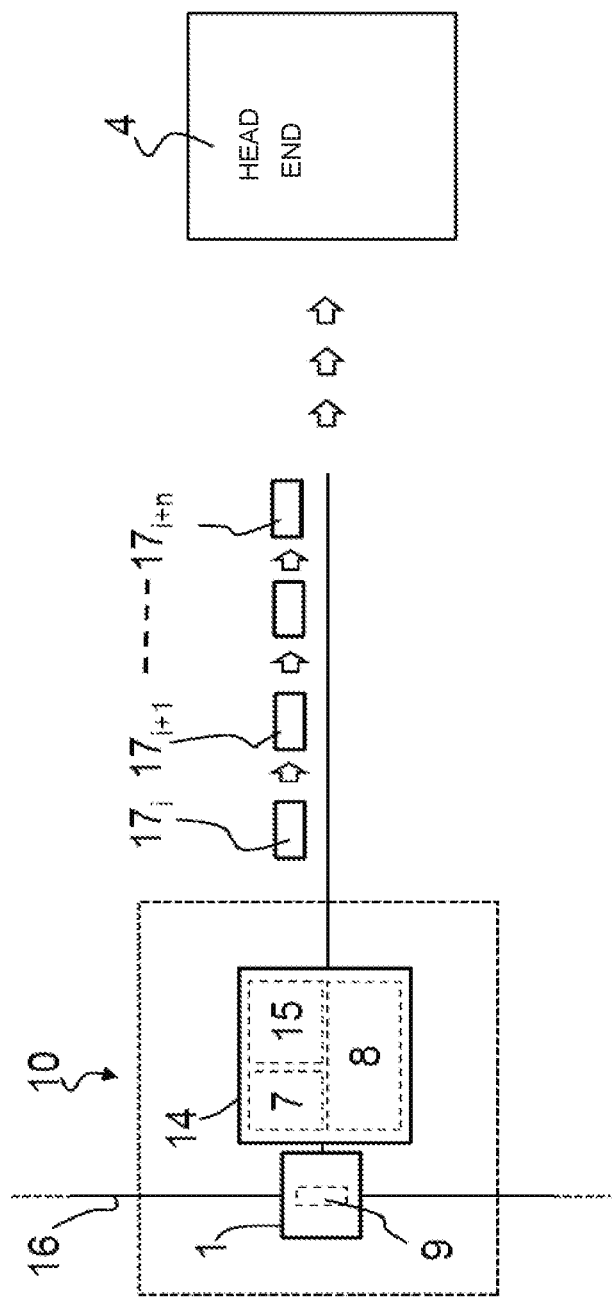
FIG. 2 shows in highly simplified schematic form an example of transmitting time stamps of characteristic raw measurement data via the primary communication path of FIG. 1 to the data collector or concentrator.

As shown in FIG. 2, the consumption meter 10 comprises a sensor 1 equipped with at least one measuring element 9. The sensor 1 is intended to produce by means of the measuring element 9, raw measurement data, which is input to a measurement data conditioner 14. Time-stamping takes place in the measurement data conditioner 14 on the basis of the raw measurement data. The raw measurement data corresponds to elementary measurement units of the at least one physical or physico-chemical variable or of the at least one physical or physico-chemical parameter, which measurement units are supplied by the measuring element 9. The raw measurement data may be, for example, raw data relating to the flow of a medium through a supply line 16, e.g. a water pipe, in particular the flow rate, the turbidity, the presence of pollutants or the presence of a solid and/or gaseous component or solid and/or gaseous components.

The measured-value conditioner 14 of the consumption meter 10 comprises memory 7, a time-reference device 15 (quartz crystal) and a microprocessor 8. Said components can be provided separately or as one integrated component. The consumption meter 10 can comprise a dedicated power supply (not shown) in the form of a battery or such like, if required. This allows the consumption meter 10 to operate self-sufficiently in energy.

Prior to the steps shown in FIG. 2, a specific value, a specific change in value or a specific difference in value of the at least one physical or physico-chemical variable or of the at least one physical or physico-chemical parameter is defined within the correlation model for the purpose of assigning a time stamp TS.

As shown in FIG. 2, the following steps are performed in at the consumption meter 10:

actuating a time stamp TS when the measuring element (9) detects the specific value, the specific change in value or the specific difference in value;

saving the time stamps TS in the memory 7 of the sensor 1 or of the consumption meter 10;

transmitting the time stamps TS in compressed form via a radio path 11, by preparing in the measurement data conditioner 14 time-stamp telegrams $17_i$, $17_{i+1}$, $17_{i+n}$; which are transmitted in succession to a central processing system such as a head-end 4, for instance. The microprocessor 8 performs the compression of the time stamps TS for the transmission.

Data telegrams $17_i$, $17_{i+1}$, . . . , $17_{i+n}$ containing consecutive time stamps TS are hence transmitted successively in time. A continuous, contiguous raw measurement-data stream of very high resolution can be reconstructed from these time stamps TS at the receiver end using the correlation model.

The preferably compressed time stamps TS are transmitted via, for example, a measurement-data information network, which comprises a primary communication path 5 in the form of a radio path 11 to a data collector 3. The data collector 3 is itself connected to the head-end 4 via a tertiary communication path 6. The data can be transmitted along the tertiary communication path 6 in various ways, for instance via LAN, GPRS, LTE, 3G, etc.

Figure 3:
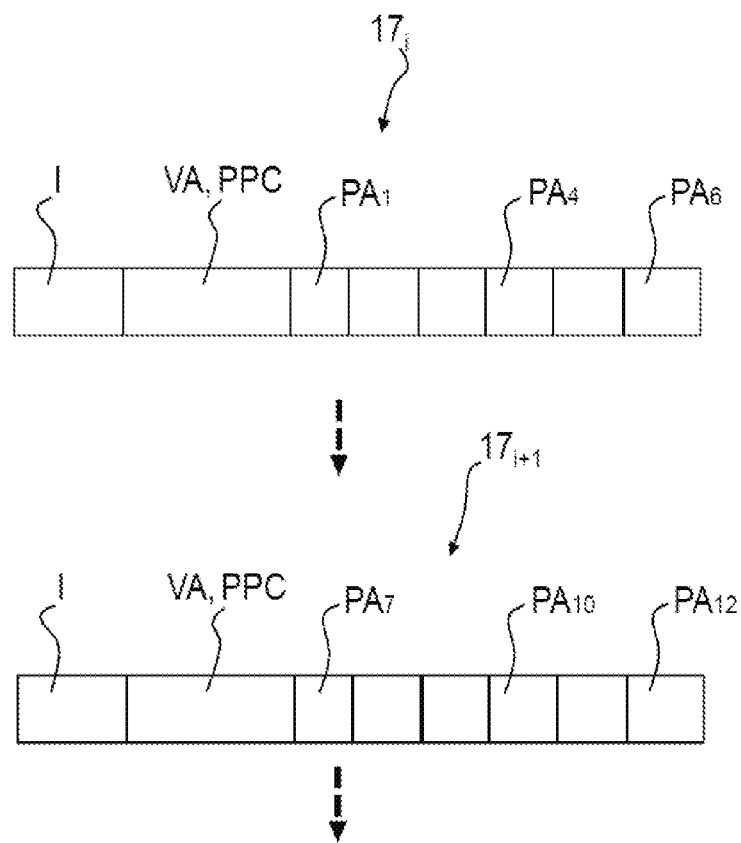
FIG. 3 shows an example of a message structure, which is emitted by, or retrieved from, the measurement data conditioner of the consumption meter shown in FIG. 2.

FIG. 3 shows by way of example the individual data telegrams $17_i$, $17_{i+1}$, . . . , $17_{i+n}$ of FIG. 2 in slightly more detail. The data telegrams $17_i$, $17_{i+1}$, . . . , $17_{i+n}$ each comprise a plurality of data packets $PA_1$-$PA_6$ and $PA_7$-$PA_{12}$, the absolute or cumulative value VA, the identity (address) I of the sensor 1 concerned and the value of at least one other physical or physico-chemical parameter PPC of the environment of the sensor 1 concerned or of the fluid measured by said sensor at a specific time, for instance a parameter such as the conductivity of the fluid, the temperature of the fluid, the pH value of the fluid, the pressure of the fluid, a parameter representative of the quality and/or the composition of the fluid, and/or of the temperature of the environment in which the sensor 1 is fitted.

As FIG. 3 also shows by way of example, it can be provided to package the compressed time stamps TS by formatting the $PA_j$ packets, the size of which must not exceed a specified maximum value, wherein a new packet or telegram is formed, or a new transmission is actuated, wherever the accumulated data reaches the size of a packet $PA_j$, unless the specified time interval has elapsed first.

According to a preferred variant of the invention, the time stamps TS are compressed prior to being transmitted. The time stamps TS can be compressed in a loss-free manner.

Alternatively, the time stamps can also be compressed at a specified admissible loss level. In fact, if the user or operator prioritizes energy saving and accepts a certain degree of imprecision in the restoration and reproduction of the original raw measurement data (i.e. accepts a certain loss), the compression ratio can be increased at the expense of lower precision in the reproduction at the receiver end. This loss ratio or the compression ratio can be provided as a programmable or configurable parameter, which defines or sets the compression mode.

The following examples of data compression algorithms, which are illustrative and shall have no limiting effect, can be considered in the context of the present invention: differential encoding (Delta encoding) in conjunction with Huffman coding, run-length encoding (RLE) or preferably adaptive binary arithmetic coding (CABAC).

There is also the option to delete the time stamps TS in the memory 7 of the consumption meter 10 only once the transmission of the time stamps TS has been confirmed by the receiver and/or data collector 3.

Thanks to the invention, it is possible to have available at the data collector 3 or receiving location (e.g. head-end 4) information that facilitates faithful and complete reconstruction of all the data from the various sensors 1 on the basis of the supplied time stamps TS at a very high temporal resolution, and allows unlimited flexibility in the analysis of this data. For instance, it is possible to provide for the potential upgrading of business functions easily and centrally without affecting the functionality or even the design of modules (sensors, communication means, and the like).

The sensor 1 can have a simpler design and be more reliable in operation than previously known solutions. Moreover, the energy consumption of the module comprising the sensor 1 and the communication means 2 is lower than in the latest implementations that analyze the data locally.

The invention can be applied to the measurement and remote reading of the most varied parameters and variables. It suffices to be able to date precisely an elementary change (measurable by the sensor 1) in a parameter or in a variable in accordance with the resolution of the sensor 1 in question (the time stamp TS can correspond to the resolution of the sensor 1 or possibly a multiple of this resolution).

If the measured variable or the measured parameter may also have a decremental change, the time stamps TS are signed elementary measurement units (positive or negative units).

In connection with an advantageous use of the invention associated with the notion of consumption, it can be provided that the measured physical variable, or one of the measured physical variables, relates to a flow medium, in which case each time stamp TS corresponds to an elementary fluid volume, which is measured by the sensor 1 according to the measurement accuracy thereof. For example, the measured fluid may be gas, water, fuel or a chemical substance.

Alternatively or cumulatively to the aforementioned embodiment variant, the invention can also provide that the measured physico-chemical variable, or one of the measured physico-chemical variables, is selected from the group composed of temperature, pH value, conductivity and pressure of a fluid flowing through, or making contact with, the sensor 1 concerned.

If, alternatively or cumulatively, at least one parameter is measured, this physical or physico-chemical parameter, or one of these physical or physico-chemical parameters, can be representative of the quality and/or composition of a fluid flowing through, or in contact with, the sensor 1 concerned, for instance a parameter such as turbidity, the presence of pollutants or the presence of a solid and/or gaseous component or solid and/or gaseous components.

The aforementioned variables and parameters are obviously only examples and have no limiting effect.

Thus data telegrams 17 are formed consecutively at a specific time and transmitted in succession. The individual data packets $PA_1, \ldots, PA_n$ then form in their totality a continuous time-stamped raw measurement-data stream 13.

Figure 4:
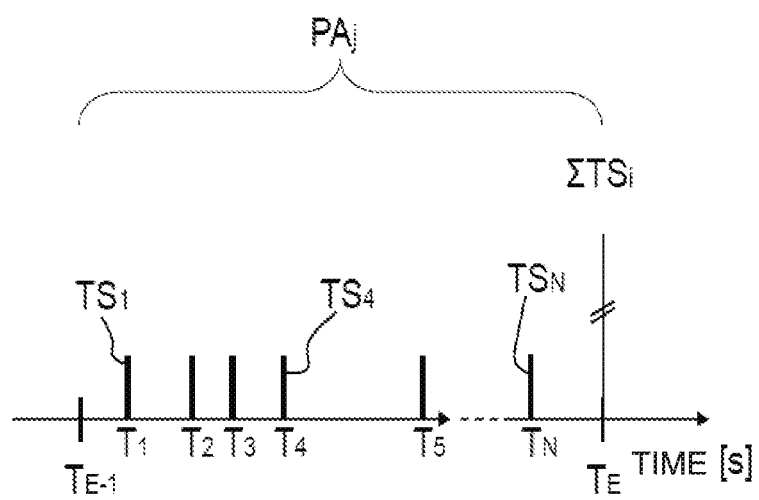
FIG. 4 shows an example of a chronogram of time stamps of the raw measurement data read from a sensor between two uplink transmission processes (messages or telegrams emitted at times TE-1 and TE), in a context of remote readout of the volume consumption (in this case the packet $PA_j$ contains N time stamps $TS_N$)

FIG. 4 shows by way of example an example of a message structure, which is transmitted from the sensor 1 or consumption meter 10 to the data collector 3 or to the head-end 4. Each time stamp $TS_1$ to $TS_N$ here corresponds within the correlation model to an elementary fluid volume, which is measured by the sensor 1. For example, the measured fluid may be gas, water, fuel or a chemical substance. Thus in the time interval $T_{E-1}$ to $T_E$, N pulses are measured and the time stamps $TS_1$ to $TS_N$ stored, which for a volume of e.g. one liter per time stamp TS equates to a flow rate of in total N liters within this time interval. The measured-value conditioner forms a data packet $PA_j$, which contains N time stamps $TS_1$ to $TS_N$. As shown in FIG. 3, data telegrams $17_i$, $17_{i+1}$ are formed from the plurality of data packets, for instance $PA_1$ to $PA_6$ and $PA_7$ to $PA_{12}$.

In order for the method according to the invention to be able to adapt to changes in the evolution of the parameter or of the measurement variable while ensuring satisfactory updating of the available instantaneous data, the method can advantageously consist in forming a new packet or telegram 17 or performing a new data transmission in the form of a message or telegram, as soon as at least one of the two following conditions is met:
(a) a specified time interval has elapsed; and
(b) a specified amount of, in particular compressed, collected data or time stamps TS is reached since the previous transmission.

Applying said condition (b) can consist in, for example, regularly checking, once a specified number of new time stamps TS has been created, the size of all the new time stamps TS in compressed form.

If these sizes lie close to a critical size, for example close to the size of a packet defined by the transmission protocol, a new transmission process is performed (condition (b) verified before condition (a)) unless the predefined limit value between two successive transmissions has been reached first (condition (a) verified before condition (b)).

As shown in FIG. 3 by way of example, it can also be provided that the identity (address) I of the sensor 1 concerned and/or the absolute or cumulative value VA of the physico-chemical variable or parameter measured by the sensor 1 concerned can also be transmitted together with the $PA_1$ packets of the time stamps TS in the respective data telegrams $17_i, 17_{i+1}, \ldots, 17_{i+n}$, wherein the value VA can be given a time stamp or can be assigned to an item of the elementary time-stamped measurement data, for instance to an index value of a fluid meter. For instance, the value VA may be—as is the case in the exemplary embodiment—the meter reading of a consumption meter 10, in particular of a water meter, at a specific time, or the flow rate through the water meter since a previous data transmission (e.g. the sum of the time stamps $\Sigma TS_i$ equals the sum total $\Sigma$ of the flow rate; see FIG. 4).

The method can also consist in using the $PA_j$ packets of time stamps TS to read out and transmit the value of at least one other physical or physico-chemical parameter PPC of the environment of the sensor 1 concerned or of the fluid measured by said sensor at a specific time, for instance a parameter such as the conductivity of the fluid, the temperature of the fluid, the pH value of the fluid, the pressure of the fluid, and/or a parameter representative of the quality and/or the composition of the fluid, and/or of the temperature of the environment in which the sensor 1 is fitted.

Figure 5:
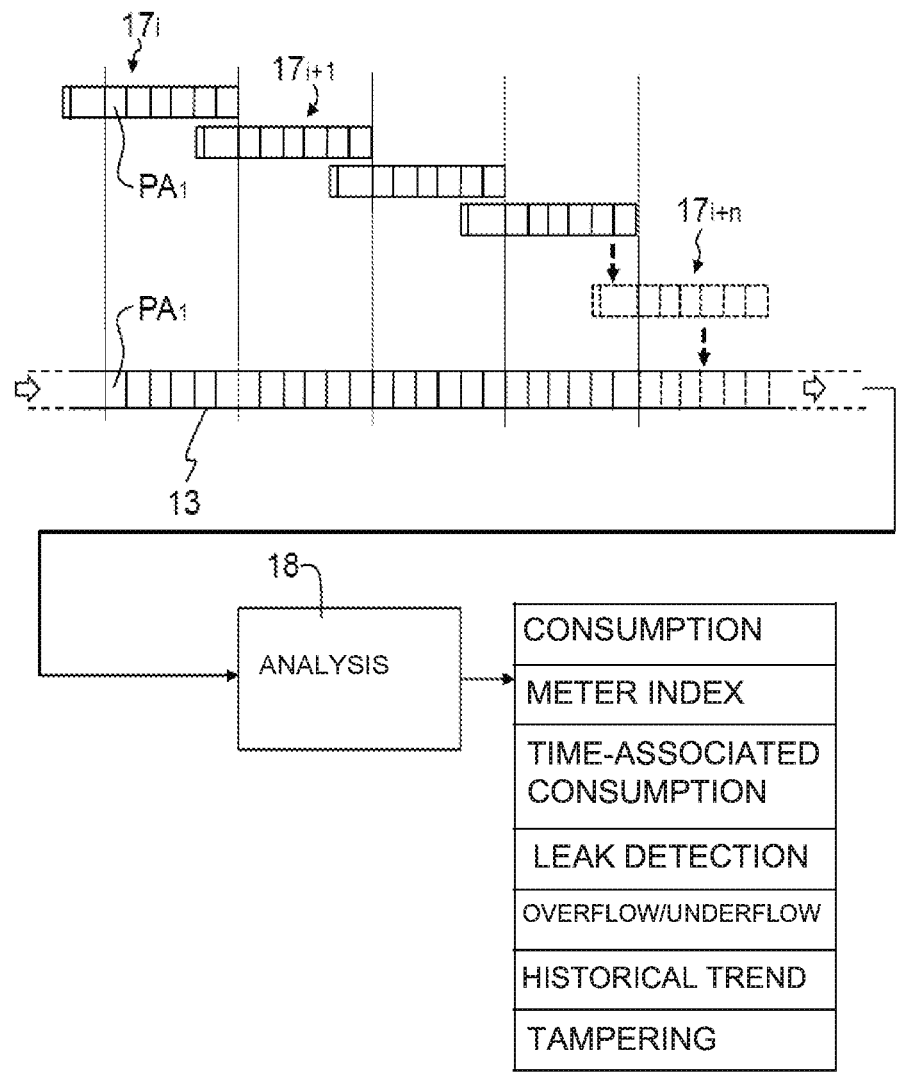
FIG. 5 shows in highly simplified schematic form an example of assembling the data packets or messages or telegrams containing the time stamps and reconstructing into a time-continuous raw measurement-data stream, and includes its analysis options.

FIG. 5 shows the further processing of the individual time stamps TS provided in data telegrams $17_i$ to $17_{i+n}$ into a consecutive, continuous association, from which a contiguous raw measurement-data stream 13 can be reconstructed by means of the correlation model. In this case, the individual data telegrams $17_i$ to $17_{i+n}$ are assembled such that the data or data packets ($PA_1$) or the time stamps TS contained therein are placed relative in time to those in the adjacent data packets $PA_j$.

By virtue of the collecting according to the invention of time stamps TS, which are supplied by the sensors 1 of the network or of a specific network, the invention allows all forms of evaluation, analysis, checking, monitoring and generally useful or desired processing and utilization, because the fundamental, individual items of raw data are available. The analysis of the time stamps TS provided is preferably performed in the region of the head-end 4 by means of an analysis device 18, or evaluation device 18, and produces a large amount of important information that is needed for managing the supply network but which hitherto could not be generated, for instance information such as consumption, meter index, time-associated consumption, leak detection, overflow/underflow, historical trend and/or tampering. Information can hence also be retrieved at any time retrospectively without time gaps and supplied to an earlier analysis.

The raw measurement data reconstructed from the time stamps TS is available according to the invention in the head-end 4 as a raw measurement-data stream 13 in very high resolution (granularity) without time gaps. Hence unlike previous methods, the amount of useful data available in the head-end 4 is far greater than hitherto as a result of the method according to the invention.

The raw measurement-data stream 13 available in the head-end 4 preferably has a resolution in the region of seconds, in the region of tenths of seconds, in the region of hundredths of seconds, or in the region of thousandths of seconds.

As shown schematically in FIG. 1, the subject of the invention is also a supply network for distributing a, in particular fluid, consumable using a primary communication path 5, and correspondingly designed consumption meters 10, which are operating in the supply network. Each consumption meter 10 comprises (cf. FIG. 2) at least one sensor 1 that can acquire raw measurement data by means of a measuring element 9. In addition, each consumption meter 10 comprises a measurement data conditioner 14, which contains a microprocessor 8, memory 7 and a time-reference device 15. In the measurement data conditioner 14 are performed time-stamping on the basis of the raw measurement data, compression of the time stamps TS, and conditioning into a format suitable for transmission along the primary communication path 5 in accordance with a specific protocol.

The consumption meter 10 comprises a dedicated power supply (not shown) in the form of a battery or such like.

Analysis means 18 are provided in the region of the head-end 4, which are able to combine the time stamps TS in the individual data telegrams $17_i$ to $17_{i+n}$ or their data packets $PA_j$ continuously in time and without gaps into a consecutive, contiguous raw measurement-data stream 13, and to perform therefrom suitable decompressions, analyses, calculations and the like. The relevant data preferably includes all the consumption meters 10 located in the supply network.

Furthermore, the aforementioned system comprises a fixed data collector 3 (concentrator) for the geographical area, or each geographical area, in which the consumption meters 10 are installed, which data collector forms with the consumption meters 10 of the area assigned to the data collector, a primary communication path 5 of the supply network. The consumption meters 10 or their sensors 1 are the slaves of the data collector 3 in this context. The data collector 3 is itself connected to the head-end 4 via a tertiary communication path 6. The data can be transmitted along the tertiary communication path 6 in various ways, for instance via LAN, GPRS, LTE, 3G, 4G, etc.

The memory 7 of each sensor 1 or consumption meter 10 preferably form a buffer memory and are suitable, and designed, for storing the contents of a plurality of $PA_j$ packets of time stamps TS in particular in the compressed state, wherein the contents, or some of the contents, of this buffer memory are transmitted in every transmission or retrieval by the data collector 3.

The information collected by each data collector 3 is conveyed directly or indirectly to the head-end 4. The business functions are also defined and executed there.

Figure 6:
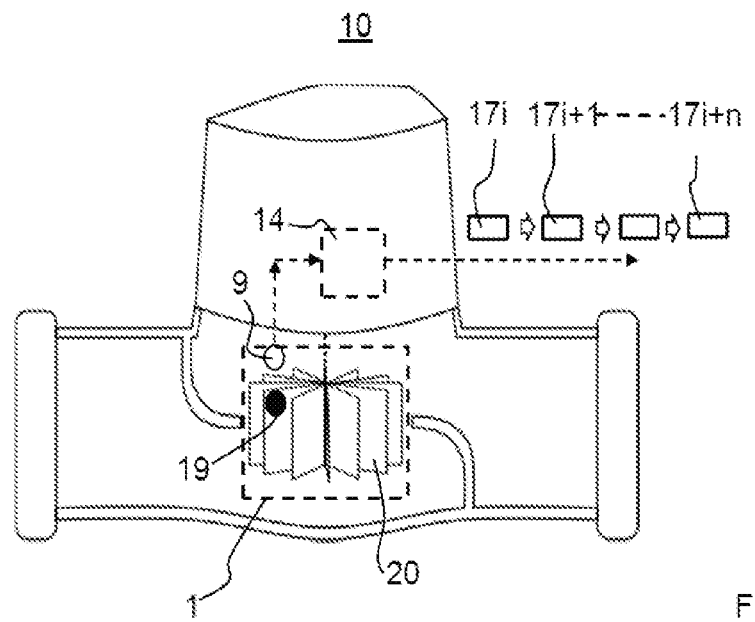
FIG. 6 shows an example of a sensor of a consumption meter in the form of a mechanical flowmeter having an impeller, which can be used to produce relevant time stamps of raw measurement data for the flow.

FIG. 6 shows purely by way of example a mechanical flowmeter 10 comprising a sensor 1 for the flow. The sensor 1 comprises an impeller 20, a measuring element 9, for instance in the form of a Hall effect sensor, and a pulse emitter element 19, which rotates to a greater or lesser extent according to the flow through the flowmeter 10. The rotational movement of the impeller 20 is detected by the measuring element 9 as a voltage value, which is stimulated by the pulse emitter element 19 as long as the relevant paddle of the impeller 20 is in the position of the measuring element 9. By means of the correlation model, it is known in the evaluation what flow volume equates to one revolution. For instance, one revolution of the impeller 20 may equate to e.g. one liter of fluid.

Figure 7:
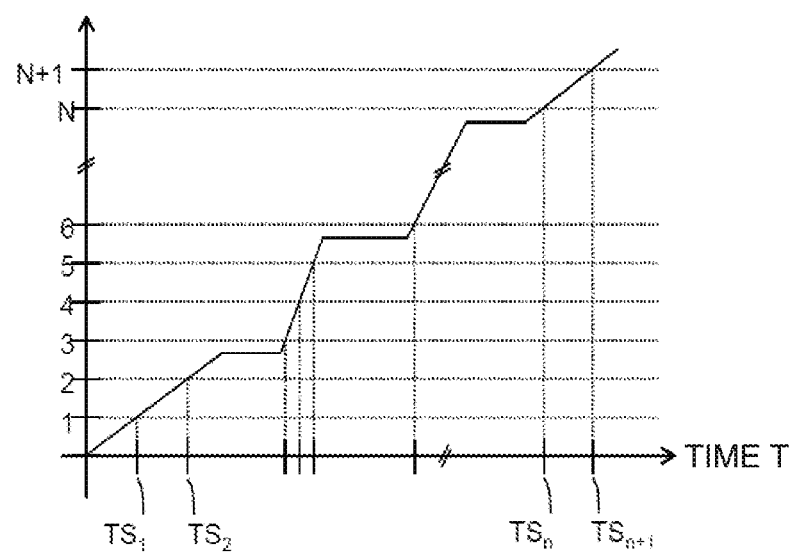
FIG. 7 shows an example of a correlation model for generating time stamps on the basis of the raw measurement data acquired by the sensor shown in FIG. 6.

In the measured-value conditioner 14 is stored a correlation model that is used to define in advance the conditions for generating time stamps TS for specific raw measured values. FIG. 7 shows in simplified form an example of such a correlation model, for instance for a continuous cumulative flow measurement. In this case, for example, the measurement unit is a pulse detected by the measuring element 9 of the sensor 1 shown in FIG. 6, for instance a voltage pulse that corresponds to one revolution of the impeller 20. The predefined resolution of the measurement method hence in this example equals one revolution of the impeller 20. The raw measured values, i.e. the pulses actuated by the revolutions, and the associated times T, are saved in the memory 7 of the sensor 1. The measured-value conditioner 14 generates for each raw measured value (i.e. for each revolution/pulse) an associated time stamp $TS_1$, $TS_2$ ... to $TS_{n+1}$. The time stamps TS are stored consecutively in the memory 7. If the impeller 20 is not rotating, no pulse is produced and hence no time-stamping takes place either. If the impeller 20 rotates more slowly, the time at which the pulse is detected occurs correspondingly later along the time axis T. Consequently, a later time stamp TS is produced in this case. As FIG. 7 shows, a multiplicity of time stamps TS are thus generated which define the flow, which is measured continuously over the timespan concerned.

The time stamps TS are combined in data packets $PA_j$ and, as shown in FIG. 2, are transmitted in succession as data telegrams $17_i$, $17_{i+1}$, $17_{i+n}$ on request by the data collector 3 via the primary communication path 5 to said data collector. The data transmission can take place in this case preferably in compressed form. Thus a continuous, contiguous time-stamp data stream of very high resolution is involved, which is transmitted in the form of the individual, consecutive data telegrams $17_i$, $17_{i+1}$, $17_{i+n}$ along the primary communication path 5.

Figure 8:
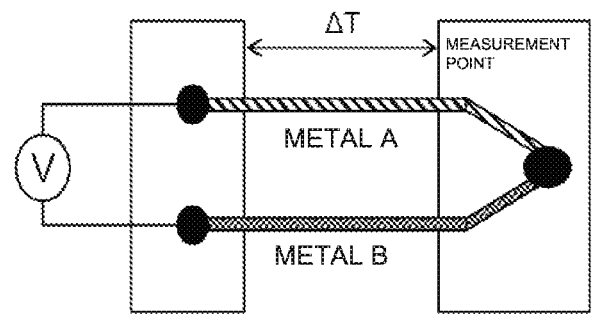
FIG. 8 shows an example of a temperature sensor in simplified form.

The collecting of data is not confined to a flow measurement. FIG. 8 shows by way of example a sensor 1 in the form of a temperature sensor based on resistance measurement. The temperature sensor comprises two metal conductors (A, B) of different thermal conductivity connected to each other in the region of a measurement point. If there is a temperature difference ΔT between the measurement point and the opposite end of the two conductors, a voltage V or voltage change can be picked up. In this case, a time stamp TS for a change in the voltage detected by the sensor can be defined as the correlation model.

Figure 9:
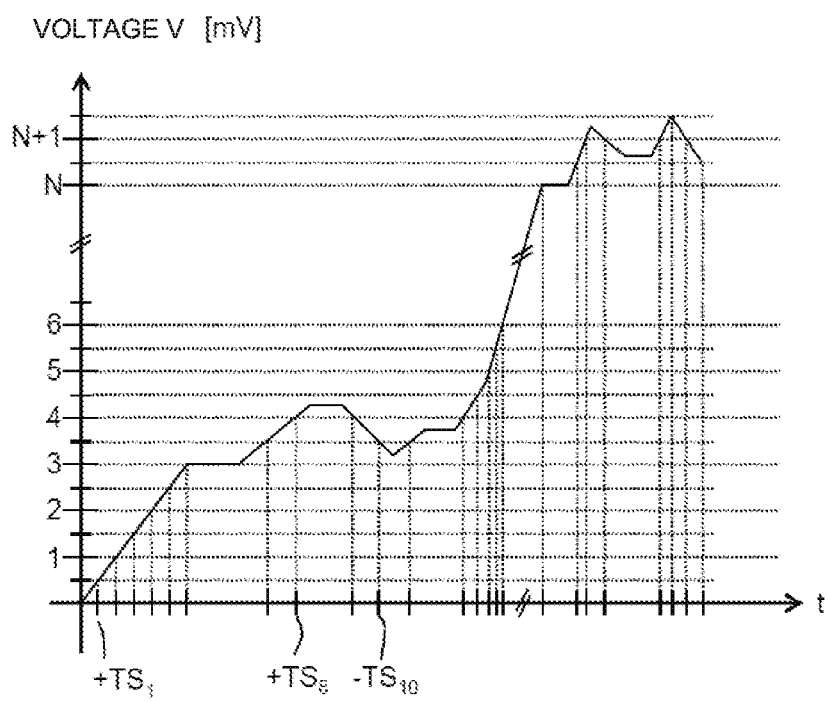
FIG. 9 shows another example of a correlation model for generating time stamps on the basis of the raw measurement data acquired by the sensor shown in FIG. 8.

FIG. 9 shows an example of a corresponding raw measurement-data curve of voltage values V for generating corresponding time stamps TS during a temperature measurement. Whenever the voltage rises or falls, for instance by 0.5 mV, an associated time stamp TS is accordingly generated. The defined resolution of the method thus equals 0.5 mV. Since the curve may rise or fall during a temperature measurement, the time stamps are in this case given a "+" sign for rising or "−" for falling. As can be seen from FIG. 9, again in this case a continuous sequence of time stamps TS is obtained, said time stamps modeling the measured voltage variation and hence the temperature extremely precisely and without gaps over the time period under consideration. If the temperature. i.e. the voltage V, does not change, no time stamp is generated. In other respects, the method corresponds to the measures presented in connection with the example of the flow measurement described earlier.

In order to ensure the completeness and consistency of the transmitted time stamps TS, the data is preferably transmitted with redundancy from each consumption meter 10 or sensor 1 to the data collector 3. The redundancy in the transmission can expediently be achieved by repeatedly sending the same data packet $PA_j$ in a plurality of successive transmission processes.

Figure 10B:
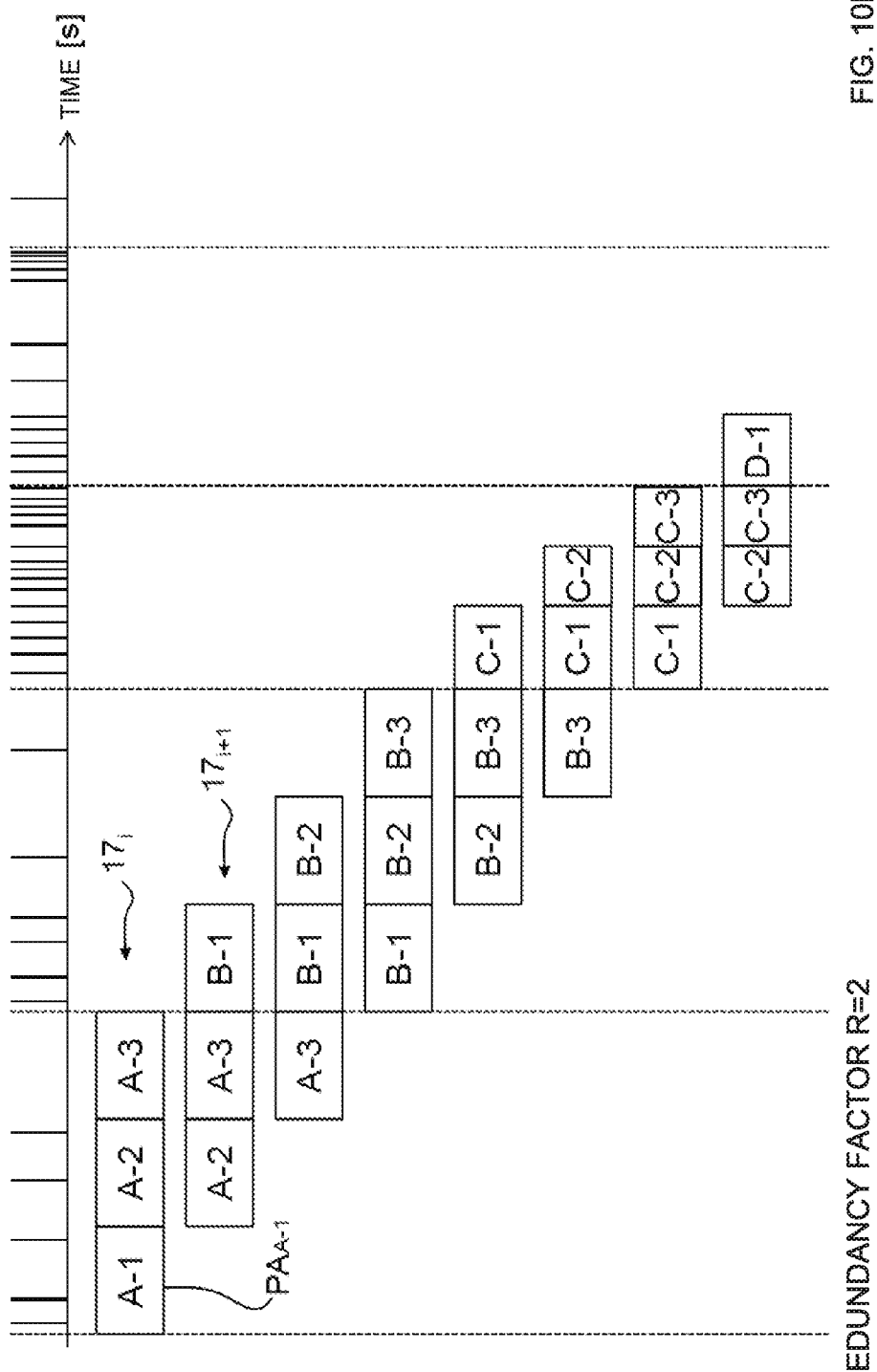
Figure 10C:
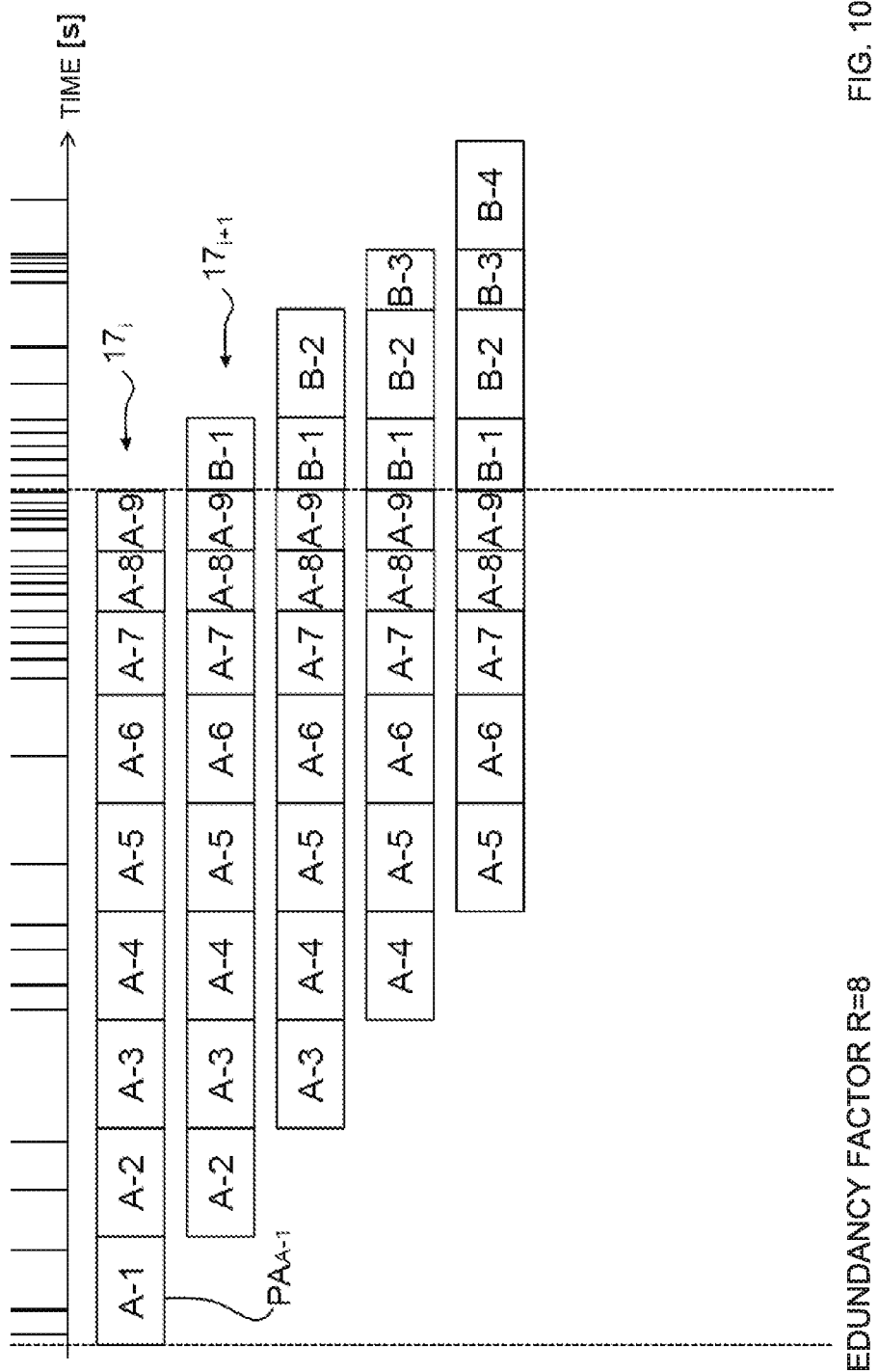

FIG. 10A, FIG. 10B, and FIG. 10C show how the redundancy in the transmission can be achieved by repeatedly transmitting the same $PA_1$ data packet by way of a plurality of successive transmission processes. The time stamps TS are plotted on the time scale. The time stamps TS are packaged by formatting into data packets $PA_j$ of a predetermined fixed size. A data packet $PA_j$ is transmitted as soon as either a specified time interval has elapsed or the accumulated time stamps TS reach the maximum size of a data packet $PA_j$. FIGS. 10A to 10C show by way of example the maximum size of a data packet $PA_j$ to be five time stamps TS. In FIG. 10A, the data packets $PA_{A-1}$ to $PA_{A-6}$ and $PA_{B-5}$ and $PA_{C-1}$ contain fewer than five time stamps TS, and therefore for these data packets $PA_j$ the transmission is actuated by the specified time interval having elapsed. For the data packets $PA_{B-1}$ to $PA_{B-4}$ and $PA_{B-6}$, the transmission has been actuated by the maximum size of the data packet $PA_j$ being reached.

The number of most recent $PA_j$ data packets formed that are incorporated in the data telegram $17_i$, $17_{+1}$, ..., $17_{i+n}$ depends on the redundancy factor R. For instance, FIG. 10A shows a redundancy factor R=5, and therefore, in addition to the current or latest data packet $PA_{A-6}$, also the preceding five data packets A-1 to A-5 are incorporated in the data telegram $17_i$ and transmitted. In the subsequent transmission, the data packets $PA_{A-2}$ to $PA_{A-6}$ are also transmitted in addition to the data packet $PA_{B-1}$. Thus the transmission of each data packet $PA_1$ is repeated five times.

In the embodiment shown in FIG. 10B, the redundancy factor is set to R=2, which means that the transmission of each data packet $PA_1$ is repeated twice. The single data telegram $17_i$ contains in addition to the latest data packet $PA_{A-3}$ also the preceding two data packets $PA_{A-1}$ and $PA_{A-2}$. Thus for a redundancy factor R=2, the single data telegram $17_i$, $17_{i+1}$, . . . , $17_{i+n}$ contains three data packets $PA_j$, whereas for a redundancy factor R=5, the data telegram $17_i$, $17_{i+1}$, . . . , $17_{i+n}$ contains six data packets $PA_j$, as shown in FIG. 10a.

In FIG. 10C, the redundancy factor is set to R=8. In this case, the most recent data packets $PA_{A-1}$ to $PA_{A-8}$ are also transmitted in addition to the newest or latest data packet $PA_{A-9}$ in the data telegram $17_i$.

The redundancy can be controlled dynamically by adjusting the redundancy factor R. The redundancy factor R is managed by the data collector 3 and/or by the head-end 4. In a first embodiment, the data collector 3 and/or the head-end 4 monitor and analyze the quality of the radio link 11, in particular of the primary communication path 5. For instance, the frame loss ratio (FLR) or the signal-to-noise ratio (SNR) or received signal strength indicator (RSSI) are used to analyze the link quality or the signal quality. Furthermore, other parameters or indicators can also be used for analysing the quality of the radio link 11. The data collector 3 and/or the head-end 4 adapts the redundancy factor R of the sensor 1 or consumption meter 10 concerned according to the ascertained link quality. If the radio link 11 has a low loss rate, for instance, and hence a good link quality, the redundancy factor R is lowered. Conversely, for a poor-quality radio link 11, the redundancy factor R is increased for the sensor 1 or consumption meter 10 concerned. Since the quality can vary over time, the link quality, and hence the redundancy factor R, is continuously monitored and adapted.

In a further embodiment, the number of redundant repetitions received in the data collector 3 and/or the head-end 4 is monitored and evaluated. Parameters and settings for the radio link 11 are adapted according to the number of repetitions received. For example, the sensors 1 or consumption meters 10 are set by default to the redundancy factor R=5. If all, or nearly all, of the repetitions, so e.g. 4 to 5 repetitions, are received, the data collector 3 and/or the head-end 4 can, for the relevant sensor 1 or consumption meter 10, reduce the transmit power thereof and/or increase the transmission interval thereof and/or raise the data rate thereof.

By means of the method according to the invention, any raw measurement data can hence be sampled and used as actuators for time stamps TS. In particular, the time stamps TS may be time instants or time differences. A start time is preferably defined.

The time stamps TS in the memory 7 of the consumption meter 10 are preferably deleted only once the transmission of the time stamps TS via the primary communication path 5 has been confirmed by the receiver or data collector 3.

It is obvious to a person skilled in the art that the invention can be applied to the measurement and remote reading of the most varied parameters and variables. It suffices to be able to date precisely an elementary change (measurable by the sensor 1) in a parameter or in a variable in accordance with the resolution of the sensor 1 in question (the time-stamped elementary variation can correspond to the resolution of the sensor or possibly a multiple of this resolution).

Obviously, the invention is not restricted to the embodiments described and shown in the accompanying drawings. Changes are still possible, in particular with regard to the provision of the various elements or as a result of technical equivalents, without departing from the scope of protection of the invention. The subject matter of the disclosure expressly includes also combinations of sub-features or subgroups of features.

The following is a list of reference numerals and symbols used in the description and illustration of the invention:

1 sensor
2 communication means
3 data collector
4 head-end
5 primary communication path
6 tertiary communication path
7 memory
8 microprocessor
9 measuring element
10 consumption meter
11 radio path
13 raw measurement-data stream
14 measurement data conditioner
15 time-reference device
16 supply line
17 data telegram
18 analysis means
19 pulse emitter element
20 impeller
TS time stamp
R redundancy factor
$PA_j$ data packet

The invention claimed is:

1. A method for collecting data during operation of a local sensor in a supply network for distributing a consumable, the method comprising:
   providing the sensor with a measuring element, with radio communication capability and a memory;
   providing elementary measuring units with the measuring element of the sensor, the elementary measuring units corresponding to at least one physical or physico-chemical variable or at least one physical or physico-chemical parameter and forming raw measurement data;
   defining a measurement resolution of the sensor by defining via a correlation model conditions for generating time stamps in advance;
   generating time stamps of successive items of raw measurement data in the sensor on a basis of the correlation model and accumulating the time stamps;
   packaging a plurality of said accumulated time stamps by formatting in data packets of a predetermined fixed size;
   transmitting said plurality of time stamps in a data packet of said predetermined fixed size along a primary communication path between the sensor and a data collector, reconstructing the raw measurement data acquired by the measuring element based on the time stamps using the correlation model, and analyzing the reconstructed measurement data; and
   thereby performing the transmitting step with a redundancy that is dynamically adaptable during operation and that is established in the transmission; and
   repeatedly sending same data packets in a plurality of successive transmissions, wherein actuating a new transmission depends on whether the accumulated number of time stamps reaches the predetermined fixed size of the data packets.

2. The method according to claim 1, which comprises:
providing a primary communication path for communication between the local sensor and a data collector;
providing a tertiary communication path between the data collector and a head-end; and
collecting, saving and/or analyzing the time stamps transmitted from the sensor in the data collector and/or in the head-end.

3. The method according to claim 1, which comprises transmitting the time stamps in compressed form.

4. The method according to claim 1, which comprises compressing the time stamps, and compressing the raw measurement data in a loss-free manner.

5. The method according to claim 1, which comprises:
defining a specific value, a specific change in value or a specific difference in value of the at least one physical or physico-chemical variable or of the at least one physical or physico-chemical parameter within the correlation model for the purpose of assigning a time stamp;
when the measuring element detects the specific value, the specific change in value or the specific difference in value, actuating a time stamp and saving the time stamp in the memory of the sensor.

6. The method according to claim 1, which comprises modeling a meter reading that increases in steps or incrementally and/or a value table within the correlation model using time stamps.

7. The method according to claim 1, which comprises providing the time stamps with a sign.

8. The method according to claim 1, which comprises transmitting a plurality of time stamps as one data packet along a primary communication path between the sensor and a data collector.

9. The method according to claim 2, which comprises generating a raw measurement-data stream using the correlation model on a basis of the time stamps received at the data collector and/or at the head-end.

10. The method according to claim 9, wherein the raw measurement-data stream has a temporal resolution that is defined or determined by the sensor sampling rate or measuring element sampling rate, or a multiple thereof.

11. The method according to claim 1, wherein the raw measurement-data stream on the basis of a continuous time resolution is continuous and/or complete.

12. The method according to claim 11, which comprises, in a further course of the data processing, analyzing the raw measurement-data stream on a time-historical basis with no time gaps, aside from the measurement resolution of the sensor.

13. The method according to claim 1, wherein the elementary measurement units are a voltage or a current.

14. The method according to claim 1, wherein the measured physical variable relates to a supply medium selected from the group consisting of water, electricity, fuel and gas, of a supply network.

15. The method according to claim 1, wherein the physical or physico-chemical parameter is an indicator of a volume, a quality and/or a composition of a fluid that is flowing through, or makes contact with, the sensor.

16. The method according to claim 1, which comprises defining a number of transmission repetitions by a redundancy factor.

17. The method according to claim 16, which comprises dynamically defining the redundancy factor by a data collector and/or a head-end.

18. The method according to claim 16, which comprises dynamically defining the redundancy factor according to a quality of a radio link.

19. The method according to claim 18, which comprises adapting properties or parameters of the radio link according to a number of received repetitions as a result of the redundancy.

20. The method according to claim 1, which comprises collecting data in connection with a consumption, a physical or physico-chemical parameter and/or an operating state, during operation of a plurality of local sensors for consumption meters as part of a supply network which includes a plurality of local sensors.

21. The method according to claim 1, which comprises generating with the elementary measurement unit a time stamp as soon as the elementary measurement unit receives a pulse.

22. A supply network for distributing a consumption medium, the supply network comprising:
at least one local sensor for generating and/or transmitting raw measurement data, said local sensor being configured for operation within a method according to claim 1;
a data collector;
a primary communication path between said sensor and said data collector;
a head-end for analyzing the measurement data; and
a tertiary communication path between said data collector and said head-end.

23. The supply network according to claim 22, wherein:
said at least one local sensor is one of a plurality of local sensors; and
the raw measurement data relate to a consumption of the consumption medium, a physical or physico-chemical parameter, and/or an operating state of a consumption meter.

24. A sensor, configured for operation in accordance with the method according to claim 1.

* * * * *